(12) United States Patent
Okabe et al.

(10) Patent No.: US 11,775,441 B2
(45) Date of Patent: Oct. 3, 2023

(54) SEMICONDUCTOR APPARATUS AND READOUT METHOD

(71) Applicant: Winbond Electronics Corp., Taichung (TW)

(72) Inventors: Sho Okabe, Kanagawa (JP); Makoto Senoo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 94 days.

(21) Appl. No.: 17/223,007

(22) Filed: Apr. 6, 2021

(65) Prior Publication Data

US 2021/0326267 A1    Oct. 21, 2021

(30) Foreign Application Priority Data

Apr. 20, 2020    (JP) ................. 2020-074503

(51) Int. Cl.
| | | |
|---|---|---|
| *G11C 16/08* | (2006.01) | |
| *G06F 12/0891* | (2016.01) | |
| *G06F 11/10* | (2006.01) | |
| *G06F 12/0879* | (2016.01) | |
| *G06F 12/0882* | (2016.01) | |
| *G11C 16/24* | (2006.01) | |
| *G11C 16/04* | (2006.01) | |

(Continued)

(52) U.S. Cl.
CPC ...... *G06F 12/0891* (2013.01); *G06F 11/1068* (2013.01); *G06F 12/0246* (2013.01); *G06F 12/0879* (2013.01); *G06F 12/0882* (2013.01); *G11C 16/0483* (2013.01); *G11C 16/08* (2013.01); *G11C 16/24* (2013.01); *G11C 16/26* (2013.01)

(58) Field of Classification Search
CPC ............ G06F 12/0891; G06F 11/1068; G06F 12/0246; G06F 12/0879; G06F 12/0882; G11C 16/0483; G11C 16/08; G11C 16/24; G11C 16/26; G11C 16/32
USPC ...................................... 365/233.18
See application file for complete search history.

(56) References Cited

U.S. PATENT DOCUMENTS

| 9,886,998 B2 | 2/2018 | Arsovski et al. |
|---|---|---|
| 2014/0104947 A1 | 4/2014 | Yamauchi et al. |

(Continued)

FOREIGN PATENT DOCUMENTS

| JP | 5323170 | 10/2013 |
|---|---|---|
| JP | 5667143 | 2/2015 |
| KR | 20140046079 | 4/2014 |

OTHER PUBLICATIONS

"Office Action of Korean Counterpart Application", dated May 25, 2021, p. 1-p. 7.

(Continued)

*Primary Examiner* — Huan Hoang
*Assistant Examiner* — Minh Dinh
(74) *Attorney, Agent, or Firm* — JCIPRNET

(57) ABSTRACT

A semiconductor apparatus implementing a high speed data output and compensating a resetting of a latch circuit is provided. A readout method of a NAND type flash memory includes: a pre-charging step performing a pre-charging on a bit line and a NAND string connected to the bit line through a sense node (SNS); a resetting step performing a resetting on the latch circuit after the pre-charging; and a discharging step performing a discharging on the NAND string after the resetting.

13 Claims, 7 Drawing Sheets

(51) Int. Cl.
*G11C 16/26* (2006.01)
*G06F 12/02* (2006.01)

(56) References Cited

U.S. PATENT DOCUMENTS

| | | | |
|---|---|---|---|
| 2016/0099070 A1* | 4/2016 | Jiang | G11C 16/26 365/185.21 |
| 2017/0228189 A1* | 8/2017 | Sudo | G11C 16/3459 |
| 2019/0340125 A1 | 11/2019 | Mondello et al. | |
| 2020/0098436 A1 | 3/2020 | Kim et al. | |

OTHER PUBLICATIONS

"Office Action of Taiwan Counterpart Application", dated Jun. 23, 2021, p. 1-p. 10.
"Office Action of Taiwan Counterpart Application", dated Mar. 12, 2021, p. 1-p. 5.

* cited by examiner (A)

(B)

SEMICONDUCTOR APPARATUS AND READOUT METHOD

CROSS-REFERENCE TO RELATED APPLICATION

This application claims the priority benefit of Japan application serial no. 2020-074503, filed on Apr. 20, 2020. The entirety of the above-mentioned patent application is hereby incorporated by reference herein and made a part of this specification.

TECHNICAL FIELD

The invention relates to a semiconductor apparatus including a flash memory and the like, and more particularly, to a continuous readout operation of pages.

BACKGROUND

In a NAND flash memory, a continuous readout function (a burst read function) may be provided for continuously reading a plurality of pages in response to an external command. A page buffer/sense circuit includes, for example, two latches. While the data read from an array is held in one of the latches, during a continuous readout operation, the data held by another latch can be output (e.g., Patent Document 1, Patent Document 2 and Patent Document 3).

PRIOR ART DOCUMENT

Patent Document

Patent Document 1: Japanese Patent Publication No. 5323170
Patent Document 2: Japanese Patent Publication No. 5667143
Patent Document 3: US Patent Application Publication No. US2014/0104947A1

SUMMARY

Problems to be Solved by the Disclosure

FIG. 1 illustrates a schematic configuration of a NAND type flash memory provided with an on chip error checking and correction (ECC) function. The flash memory includes: a memory cell array 10 including a NAND string, a page buffer/sense circuit 20, a data transmission circuit 30, a data transmission circuit 32, an error checking and correcting circuit (hereinafter, referred to as an ECC circuit) 40, and an input/output circuit 50. The page buffer/sense circuit 20 includes: two latches L1 and L2 for holding read data or input data to be programmed (e.g., one latch is, for example, 4 KB). Each of the latch L1 and the latch L2 includes a first cache C0 and a second cache C1 (one cache is, for example, 2 KB).

FIG. 2 shows a timing diagram during a continuous readout of a plurality of pages. FIG. 2 shows an example in which a page P0 is a starting address. The starting address can be arbitrarily selected. First, an array readout is performed on a page P0, and data of the page P0 is held in the first cache C0 and the second cache C1 (P0C0, P0C1) of the latch L1. Next, the data of the first cache C0 and the second cache C1 of the latch L1 is transmitted to the first cache C0 and the second cache C1 of the latch L2. The data of the first cache C0 and the second cache C1 is subjected to an ECC decoding operation in the ECC circuit 40. If an error is detected, the data of the first cache C0 and the second cache C1 of the latch L2 is calibrated.

In the continuous readout, a row address counter is automatically incremented and the next page P1 is read. The read data is then transmitted to the first cache C0 and the second cache C1 of the latch L1. Meanwhile, the data of the first cache C0 of the latch L2 is transmitted to the input/output circuit 50, and the data held by the input/output circuit 50 is output in synchronization with an external clock signal ExCLK provided from an external part. Next, the data of the second cache C1 of the latch L2 is output from the input/output circuit 50 in synchronization with the external clock signal ExCLK. Meanwhile, the data of the first cache C0 of the latch L1 is transmitted to the latch L2, and then subjected to an ECC process performed by the ECC circuit 40.

While the data of the second cache C1 of the latch L1 is transmitted to the latch L2 and the data of the first cache C0 of the latch L2 is output from the input/output circuit 50, the data of the second cache C1 of the latch L2 is subjected to the ECC process. Next, while the data of the second cache C1 of the latch L2 is output from the input/output circuit 50, a next page P2 is subjected to the array readout and transmitted to the first cache C0 and the second cache C1 of the latch L1, and the data of the first cache C0 is transmitted to the latch L2 and subjected to the ECC process.

In this way, the continuous readout of pages of the memory cell array is performed while the data is output from the latch L2. Meanwhile, the ECC process is performed on the second cache C1 while the data of the first cache C0 is output, and the ECC process is performed on the first cache C0 while the data of the second cache C1 is Here, the array readout is performed by using an internal clock signal according to a predetermined timing. On the other hand, the data is output according to the external clock signal ExCLK that is asynchronous with the internal clock signal. Therefore, the continuous readout operation has a constraint represented by Expression (1) below.

$$tARRAY + tECC < tDOUT \quad (1)$$

Here, tARRAY is a time required for reading data from a selected page of the memory cell array, tECC is a time required for performing the ECC process on ½ page, tDOUT is a time required for outputting all data of 1 page. tARRAY and a maximum of tECC (a maximum time required for ECC decoding operation and data correction) are fixed times, and tDOUT is calculated according to a frequency of the external clock signal ExCLK.

In order to read a large amount of data in a short time, it is necessary to increase the frequency of the external clock signal ExCLK. In that case, a time of tARRAY+tECC needs to be shortened as shown in Expression (1). On the other hand, in the readout operation, the latch L1 requires a resetting to receive the charge from the sense node more accurately, and the resetting is performed before a pre-charging period of the bit line. In the continuous readout operation, a resetting of the latch L1 needs to be performed after the data in the latch L1 is transmitted to the latch L2. That is, the resetting of the latch L1 needs to be performed after the data of the latch L1 is transmitted to the latch L2 and before a pre-charging period of the bit line for reading the next page. Therefore, if a start timing of tARRAY is to be advanced, the time for the resetting of the latch L1 may not be sufficiently ensured. As illustrated in FIG. 2, if a time for transmitting the data of the second cache C1 of the page P2 of the latch L1 to the latch L2 is ts and a period from the start timing of the array readout of the page P3 until completion of a pre-charging of the bit line is tp, the resetting of the latch L1 needs to be within a period tx. If a start timing for reading the next page is advanced, the period tx becomes shorter and the resetting of the latch L1 may not be compensated.

The purpose of the invention is to solve the present problems by providing a semiconductor apparatus and readout method by implementing a high speed data output and compensating a resetting of a latch circuit.

Technical Means for Solving the Problem

A readout method of a NAND type flash memory of the invention includes: a pre-charging step performing a pre-charging on a bit line and a NAND string connected to the bit line through a sense node; a resetting step electrically connecting a node of a latch circuit to a reference potential through the sense node and performing a resetting on the latch circuit after the pre-charging; and a discharging step performing a discharging on the NAND string after the resetting. Further, a readout method of a NAND type flash memory of the invention includes: a pre-charging step performing a pre-charging on a bit line and a NAND string connected to the bit line through a sense node; and a resetting step electrically connecting a node of a latch circuit to a reference potential through the sense node and performing a resetting on the latch circuit during a discharging period of the NAND string.

In an embodiment of the invention, the pre-charging step includes: generating a voltage for the pre-charging at a voltage supply node; electrically connecting the voltage supply node to the sense node by a first select transistor; and electrically connecting the sense node to the bit line by a second select transistor, and the resetting step includes: generating the reference voltage at the voltage supply node; electrically connecting the voltage supply node to the latch circuit by the first select transistor; and electrically isolating the sense node by the second select transistor.

In an embodiment of the invention, each of the steps is performed in a continuous readout of pages. In an embodiment of the invention, the continuous readout of the pages includes: holding data read from a selected page of a memory cell array in the latch circuit, and after the data held in the latch circuit is transmitted to another latch circuit, holding data read from a next selected page in the latch circuit; and continuously outputting the data held in the another latch circuit to an external part in synchronization with an external clock signal. In an embodiment of the invention, the continuous readout of the pages further includes: while performing an error check and correction (an ECC process) on data of a first part of the another latch circuit, outputting data of a second part subjected to the ECC process to the external part, and while outputting the data of the first part subjected to the ECC process to the external part, performing the ECC process on the data of the second part. In an embodiment of the invention, the method further includes: after the data of the first part of the another latch circuit subjected to the ECC process is outputted to the external part, transmitting data of a first part of the next selected page of the latch circuit to the first part of the another latch circuit; and after the data of the second part of the another latch circuit subjected to the ECC process is outputted to the external part, transmitting data of a second part of the next selected page of the latch circuit to the second part of the another latch circuit. In an embodiment of the invention, the continuous readout is a first continuous readout having a constraint expressed by tARRAY+tECC<tDOUT (each of the data of the first part and the data of the second part is data of ½ page, tARRAY is a time required for reading the selected page, tECC is a time required for performing the ECC process on ½ page, tDOUT is a time required for outputting all data of one page). In an embodiment of the invention, the continuous readout is a second continuous readout having a constraint expressed by tARRAY<tDOUT and tECC<tDOUT(½ page) (each of the data of the first part and the data of the second part is data of ½ page, tARRAY is a time required for reading the selected page, tECC is a time required for performing the ECC process on ½ page, tDOUT is a time required for outputting all data of one page, tDOUT(½ page) is a time required for outputting data of ½ page). In an embodiment of the invention, the second continuous readout has a earlier read timing for the selected page of the memory cell array compared to the first continuous readout.

A semiconductor apparatus of the invention includes: a NAND memory cell array; a readout component, reading data from a selected page of the memory cell array, an output component, outputting the data read by the readout component to an external part, wherein the readout component comprises a page buffer/sense circuit connected to the memory cell array through a bit line, and while performing a continuous readout of pages, the readout component implements a resetting of a latch circuit included by the page buffer/sense circuit between a pre-charging period of the bit line and a discharging period of a NAND string. Further, a semiconductor apparatus of the invention includes: a NAND memory cell array; a readout component, reading data from a selected page of the memory cell array, an output component, outputting the data read by the readout component to an external part, wherein the readout component comprises a page buffer/sense circuit connected to the memory cell array through a bit line, and while performing a continuous readout of pages, the readout component implements a resetting of a latch circuit included by the page buffer/sense circuit in a discharging period of a NAND string after a pre-charging is performed on the bit line.

In an embodiment of the invention, the page buffer/sense circuit includes: a voltage supply node, a sense node, a latch circuit, a first select transistor connected between the voltage supply node and the sense node, a second select transistor connected between the sense node and the bit line, and a third select transistor connected between the sense node and the latch circuit, wherein the resetting is performed on the latch circuit by turning on the first select transistor and the third select transistor, turning off the second select transistor, and electrically connecting the latch circuit to a reference potential of the voltage supply node. In an embodiment of the invention, the readout component turns on the first select transistor and the second select transistor, turns off the third select transistor, and pre-charges the bit line with a voltage of the voltage supply node. In an embodiment of the invention, when the readout component performs a continuous readout of pages, the output component continuously outputs the read data in synchronization with an external clock signal. In an embodiment of the invention, the page buffer/sense circuit further comprises another latch circuit for receiving the data held by the latch circuit, and when performing the continuous readout, the readout component causes the latch circuit to hold the data read from a next selected page of the memory cell array while the data of the other latch circuit is output. In an embodiment of the invention, the semiconductor apparatus further comprises an ECC circuit for performing an error checking and correction for data, when performing the continuous readout, the readout component outputs data held by a second part of the another latch circuit subjected to an ECC process while the ECC process is performed on data held by a first part of the another latch circuit through the ECC circuit.

Effect of the Invention

According to the invention, the resetting of the latch circuit included in the page buffer/sense circuit is performed between the pre-charging period of the bit line and the discharging period of the NAND string, so that the high speed data output can be implemented and the resetting of the latch circuit can be compensated.

DETAILED DESCRIPTION

Next, embodiments of the invention will be described in detail with reference to the drawings. The semiconductor apparatus according to the invention is, for example, a NAND type flash memory, or a microprocessor, a microcontroller, a logic, an application specific integrated circuit (ASIC), a processing images and audio or processor for processing a signal such as a wireless signal (which are embedded in said NAND type flash memory). In the following description, a NAND flash memory will be exemplified. In one embodiment, the NAND flash memory is equipped with an SPI (Serial Peripheral Interface) for compatibility with an NOR flash memory which enables a continuous readout of a plurality of pages in synchronization with an external clock signal.

Embodiments

Figure 3:
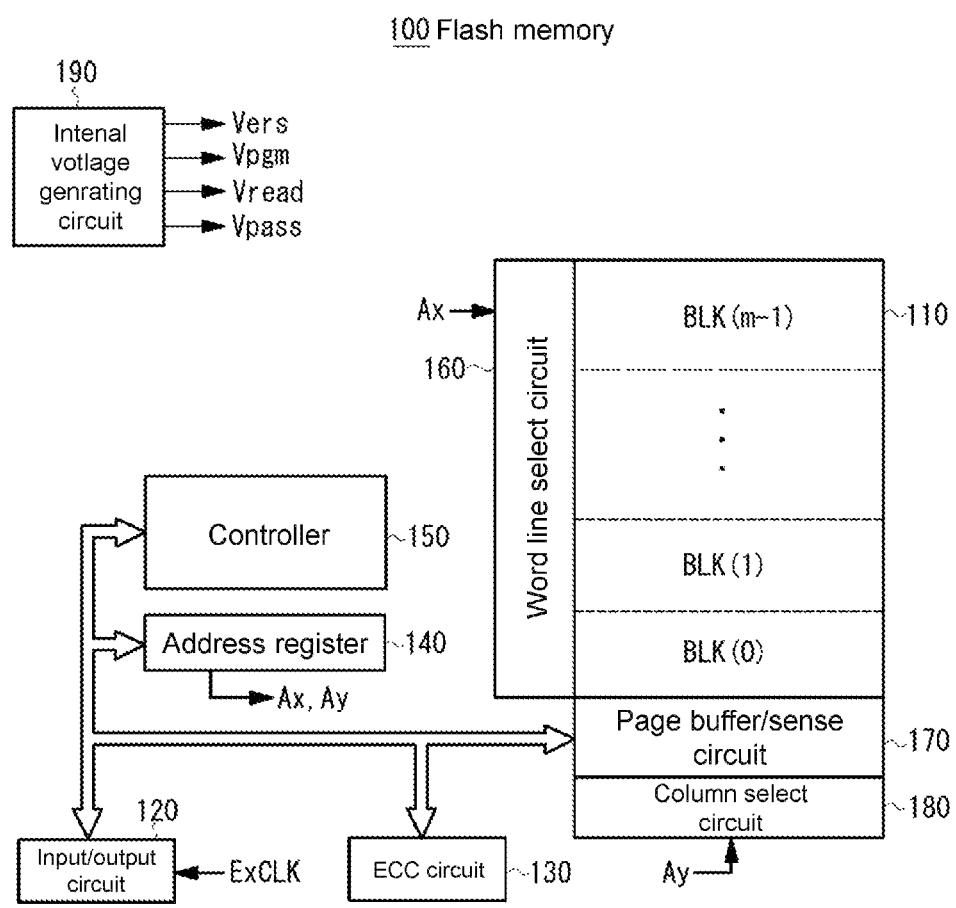
FIG. 3 is a block diagram illustrating a configuration of a NAND type flash memory in an embodiment of the invention.

FIG. 3 is a block diagram illustrating a configuration of a NAND type flash memory according to an embodiment of the invention. A flash memory 100 of the present embodiment includes: a memory cell array 110, in which a plurality of memory cells are arranged in an array; an input/output circuit 120, connected to an external input/output terminal, and outputting read data to an external part or obtain data input from the external part in response to the external clock signal ExCLK; an ECC circuit 130, performing a code generation of data to be programmed and an error check and correction of read data; an address register 140, receiving address data through the input/output circuit 120; a controller 150, controlling each unit based on command data received through the input/output circuit 120 or a control signal applied to a terminal; a word line select circuit 160, receiving row address information Ax from the address register 140, decoding the row address information Ax, and performing a block selection or a word line selection based on a decoding result; a page buffer/sense circuit 170, holding data read from a page selected by the word line select circuit 160, or holding data to be programmed into a selected page; a column selection circuit 180, receiving column address information Ay from the address register 140, decoding the column address information Ay, and performing a column selection on the page buffer/sense circuit 170 based on a decoding result; and an internal voltage generating circuit 190, generating various voltages (a write voltage Vpgm, a pass voltage Vpass, a read pass voltage Vread, an erase voltage Vers, etc.) required for reading, programming and erasing data.

Figure 4:
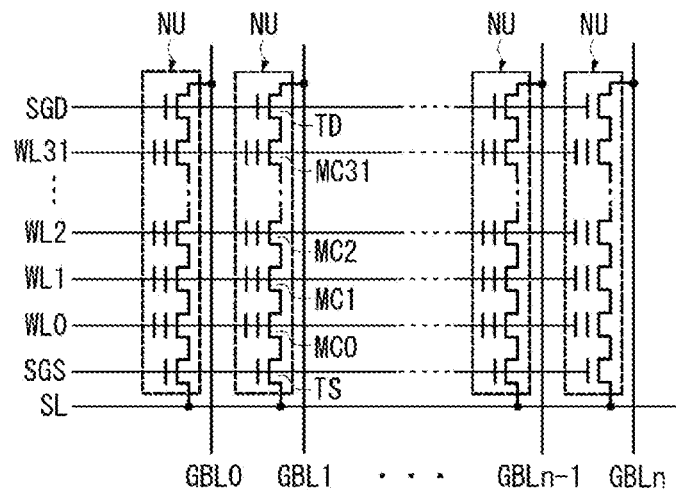
FIG. 4 is a diagram illustrating a configuration example of a NAND string of the flash memory in an embodiment of the invention.

The memory cell array 110 has, for example, m memory blocks BLK(0), BLK(1), . . . , and BLK(m−1) disposed along a column direction. In one memory block, a plurality of NAND strings are formed, and the NAND string is formed by connecting a plurality of memory cells in series. As shown in FIG. 4, one NAND string NU includes: a plurality of memory cells connected in series MCi (i=0, 4, . . . , 31), a bit line side select circuit TD and a source line side select circuit TS. A drain of the bit line side select transistor TD is connected to one corresponding bit line GBL, and a source of the source line side select transistor TS is connected to a common source line SL. A control gate of the memory cell MCi is connected to a word line WLi, and gates of the bit line side select transistor TD and the source line side select transistor TS are connected to a selected gate line SGD and a selected gate line SGS, respectively. The word line select circuit 160 drives the bit line side select transistor TD and the source line side select transistor TS through the selected gate line SGS and the selected gate line SGD based on the row address information Ax in order to select the block or the word line.

The NAND string may be two-dimensionally formed on a surface of a substrate, and may also three-dimensionally be formed on the surface of the substrate. Further, the memory cell may be a SLC (Single Level Cell) type for storing one bit (binary data) and may also be an MLC (Multi Level Cell) type for storing multiple bits.

Figure 5:
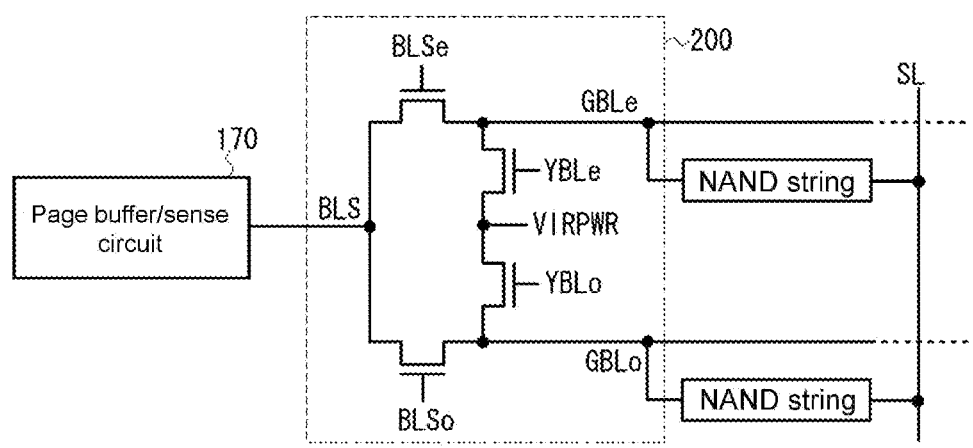
FIG. 5 is a diagram illustrating a configuration of a bit line select circuit of the flash memory in an embodiment of the invention.

FIG. 5 shows the configuration of the bit line select circuit. FIG. 5 illustrates one page buffer/sense circuit 170 shared by one even bit line GBLe and one odd bit line GBLo, and a bit line select circuit 200 connected thereto.

The bit line select circuit 200 includes a transistor BLSe for selecting the even bit line GBLe, a transistor BLSo for selecting the odd bit line GBLo, a transistor YBLe for connecting a virtual power VIRPWR to the even bit line GBLe, a transistor YBLo for connecting the virtual power VIRPWR to the odd bit line GBLo, a NAND string connected between the even bit line GBLe and the source line SL, and a NAND string connected between the odd bit line GBLo and the source line SL. For example, when a shield readout is performed in the readout operation, the odd bit line GBLo is not selected if the even bit line GBLe is selected, and the even bit line GBLe is not selected if the odd bit line GBLo is selected. The non-selected bit line is connected to a ground (GND) level through the virtual power VIRPWR.

Figure 6:
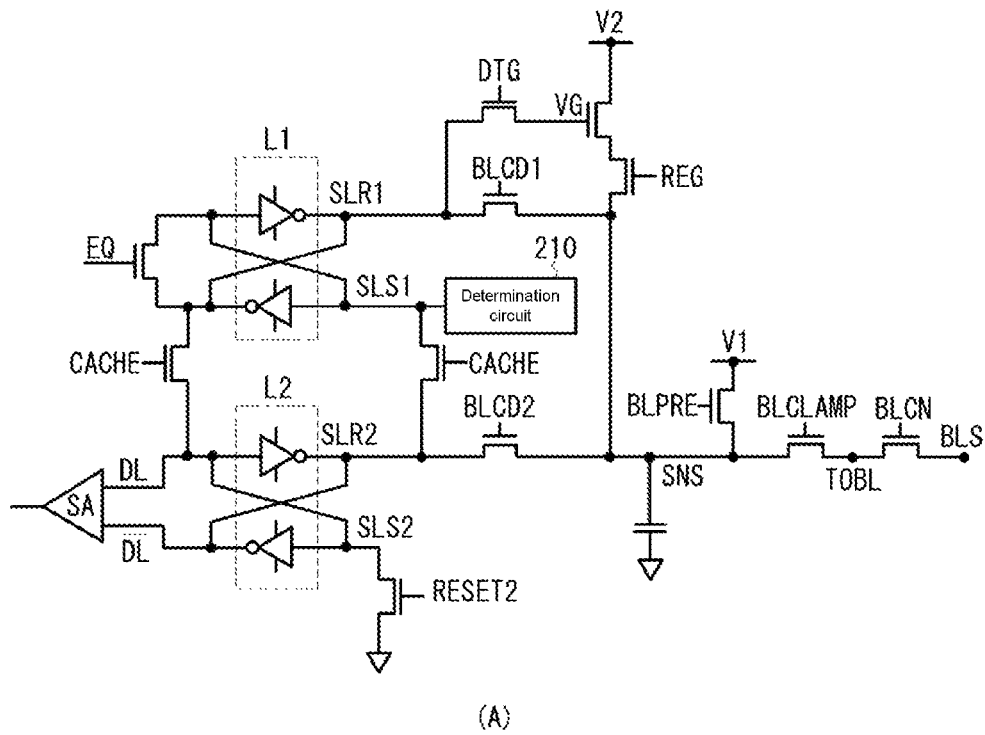
FIG. 6 is a diagram illustrating a configuration of a page buffer/sense circuit of the flash memory in an embodiment of the invention.
Figure 6:
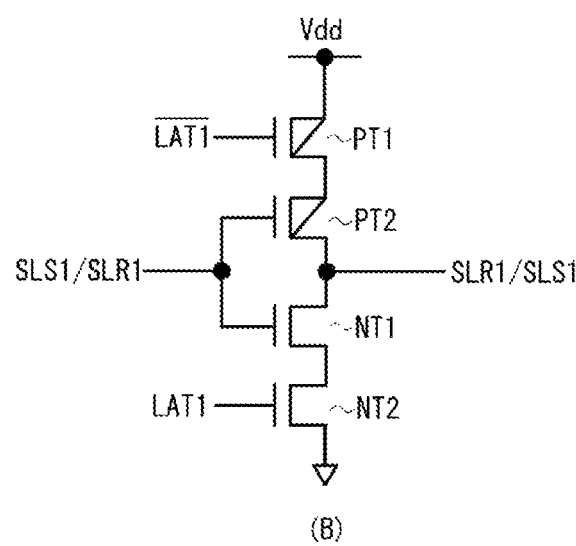

FIG. 6A shows the configuration of the page buffer/sense circuit 170. FIG. 6A shows one page buffer/sense circuit. For convenience, it is assumed that the signal applied to the gate of a transistor represents that transistor. The page buffer/sense circuit 170 includes two latches L1 and L2. A transmission gate (a transistor CACHE) is connected between the latch L1 and the latch L2, and a bidirectional data transmission from the latch L1 to the latch L2 or from the latch L2 to the latch L1 may be performed by turning on the transmission gate.

The latch L1 includes a pair of cross-coupled inverters. A node SLR1 of the latch L1 is connected to a common source/drain (S/D) of a transistor BLCD1 and a transistor DTG. A node SLS1 is connected to a determination circuit 210. The determination circuit 210 determines, for example, whether a program verification or an erase verification is successful. The transistor DTG is turned on when the node SLR1 is selectively charged to Vdd from a voltage supply node V2 or the node SLR1 is selectively discharged to GND in the program verification. Accordingly, the latch L1 can short-circuit the node SLR1 and the node SLS1 through a transistor EQ.

The node SLR1 and the node SLS1 of the latch L1 are connected to a node SLS2 and a node SLR2 of the latch L2 through the transistor CACHE, respectively. The node SLR2 of the latch L2 is connected to the sense node SNS through a transistor BLCD2, and the node SLS2 is connected to a transistor RESET2. When a resetting is performed on the latch L2, the transistor RESET2 is turned on. In addition, the node SLS2 and the node SLR2 are connected to a differential sense amplifier SA through a data line DL and a data line/DL, and an output of the differential sense amplifier SA is connected to the input/output circuit 120.

A transistor VG and a transistor REG are connected in series between the voltage supply node V2 and the read node SNS, and a gate of the transistor VG is connected to the S/D of the transistor DTG. A voltage supply node V1 is connected to the sense node SNS through a transistor BLPRE. As will be described later, the voltage supply node V1 supplies an internal supply voltage Vdd when performing a pre-charging on the bit line, and supplies a GND potential when performing the resetting on the latch L1. A transistor BLCN and a transistor BLCLAMP are connected in series between the sense node SNS and a node BLS of the bit line select circuit 200.

FIG. 6B shows a circuit configuration of one inverter that constitutes the latch L1. The inverter includes four transistors connected in series, including a P-type transistor PT1, P-type transistor PT2, an N-type transistor NT1 and an N-type transistor NT2. A latch enable signal/LAT1 and a latch enable signal LAT1 are input to gates of the transistor PT1 and the transistor NT2, respectively. A voltage of the nodes SLS1/SLR1 is input to a common gate of the transistor PT2 and the transistor NT1. When the latch enable signal LAT1 is at an H level, the inverter can operate. When the latch enable signal LAT1 is at a L level, the transistor PT2 and the transistor NT1 are in the tristate state separated from the internal supply voltages Vdd and GND so that the inverter can be reset. Since the resetting of the latch L1 is performed by using a current path passing through the sense node SNS. Therefore, the resetting is performed when the sense node SNS is free, that is, when the sense node SNS is not adversely affected.

The word line select circuit 160 and the column select circuit 180 (see FIG. 3) select a readout starting position of data in the pages according to the row address information Ax and the column address Ay, or automatically read the data from a starting position of the pages without using a row address and a column address. Further, the word line select circuit 160 and the column select circuit 180 may include a row address counter and a column address counter that increment the row address and the column address in response to a clock signal.

During the readout operation of the flash memory, a specific positive voltage is applied to the bit line; a specific voltage (e.g., 0V) is applied to a selected word line; the pass voltage Vpass (e.g., 4.5V) is applied to a non-selected word line; a positive voltage (e.g., 4.5V) is applied to the selected gate line SGD and the selected gate line SGS so that the bit line side select transistor TS and the source line side select transistor TS are turned on and 0V is applied to the common source line. In the program operation, the program voltage Vpgm with high voltage (15V to 20V) is applied to the selected word line; an intermediate potential (e.g., 10 V) is applied to the non-selected word line to turn on the bit line side select transistor TD, turn off the source line side select transistor TS, and supply a potential corresponding to data of "0" or "1" to the bit line. In the erase operation, 0V is applied to the selected word line in the block; a high voltage (e.g., 20V) is applied to a P-well; electrons of the floating gate to are extracted a substrate; the data is erased using block as a unit.

Figure 1:
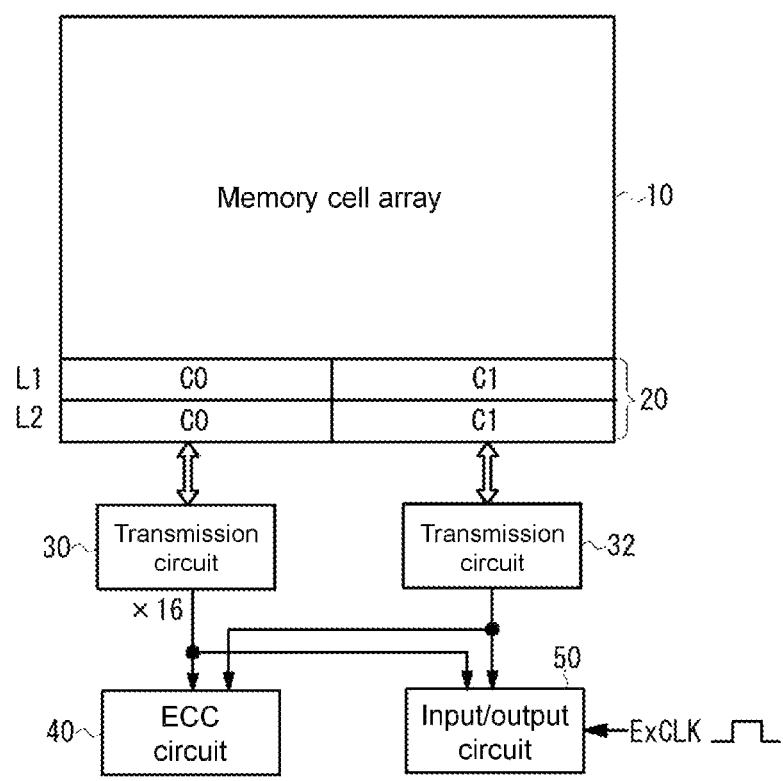
FIG. 1 is a diagram illustrating a schematic configuration of a conventional NAND type flash memory according to an embodiment of the disclosure.
Figure 2:
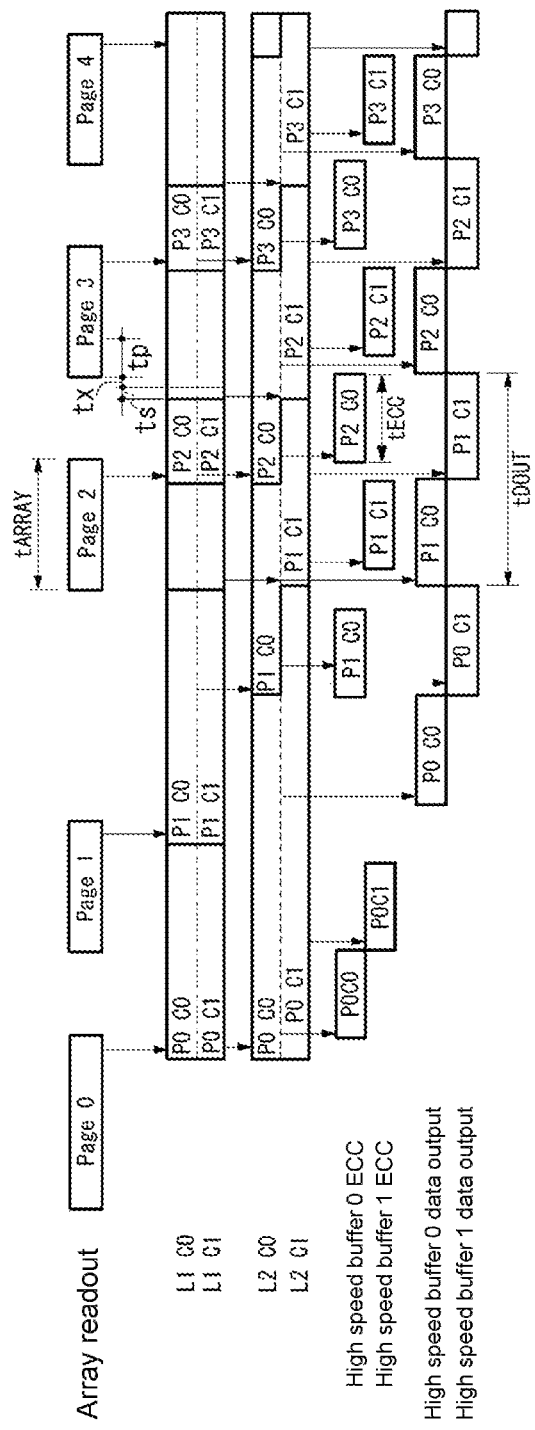
FIG. 2 is a timing diagram for a continuous readout of pages performed on the conventional NAND type flash memory.

Subsequently, the continuous readout operation of pages of the flash memory of the present embodiment is described as follows. When the controller 150 receives a command for starting the continuous readout operation of pages through the input/output circuit 120, the controller 150 controls the continuous readout operation of pages from the starting address; and when receiving a command for ending the continuous readout operation, the controller 150 ends the continuous readout operation of pages ends at an ending address. In the continuous readout operation of pages, as described with reference to FIG. 1 and FIG. 2, while data is output from the latch L2, data read from the selected page of the memory cell array is transmitted to the latch L1. The data transmission from the latch L1 to the latch L2 is performed not in units of 1 page but divided into ½ page (the first cache or the second cache). While data of one cache of the latch L2 is transmitted to the input/output circuit 120, the ECC circuit 130 processes data of another cache of the latch L2. The data transmitted to the input/output circuit 120 is output from the external input/output terminal to the external part in synchronization with the external clock signal ExCLK (e.g., a rising edge and a falling edge). A reading of data from the memory cell array and a data transmission from the latch L1 to the latch L2 are performed based on the internal clock signal. A data transmission between the latch L2 and the input/output circuit 120 and a data output from the input/output circuit 120 are performed based on the external clock signal ExCLK. A data transmission between the latch L2 and the ECC circuit 130 and operations of the ECC circuit are performed based on a clock signal obtained by dividing another internal clock signal or the external clock signal ExCLK.

When reading the selected page of the memory cell array, the sense node SNS reads the potential of the selected bit line. Then, the charge of the sense node SNS is transmitted to the node SLR1 of the latch L1 through the transistor BLCD1. For the latch L1, the transmitted charge is determined as data "1" if it is greater than or equal to a threshold and determined as data "0" if it is less than the threshold, and the data is maintained. The latch L1 resets the potential of the node SLR1 to the GND level to accurately reflect the charge transmitted from the sense node SNS. When the resetting is performed on the latch L1, the voltage supply node V1 is transitioned to GND; the transistor BLCD1 and the transistor BLPRE are turned on; the node SLR1 is electrically connected to the voltage supply node V1.

In the conventional continuous readout of the flash memory, the resetting of the latch L1 is performed before the pre-charging of the bit line when reading the next page. However, because the resetting of the latch L1 needs be performed after the data of the latch L1 is transmitted to the latch L2, the time for resetting the latch L1 may not be sufficiently ensured in the high speed data output. In order to avoid the problem, in the continuous readout operation of pages of this embodiment, the resetting of the latch L1 is performed after the pre-charging of the bit line is completed and before a discharging of the NAND string cell starts.

Figure 7:
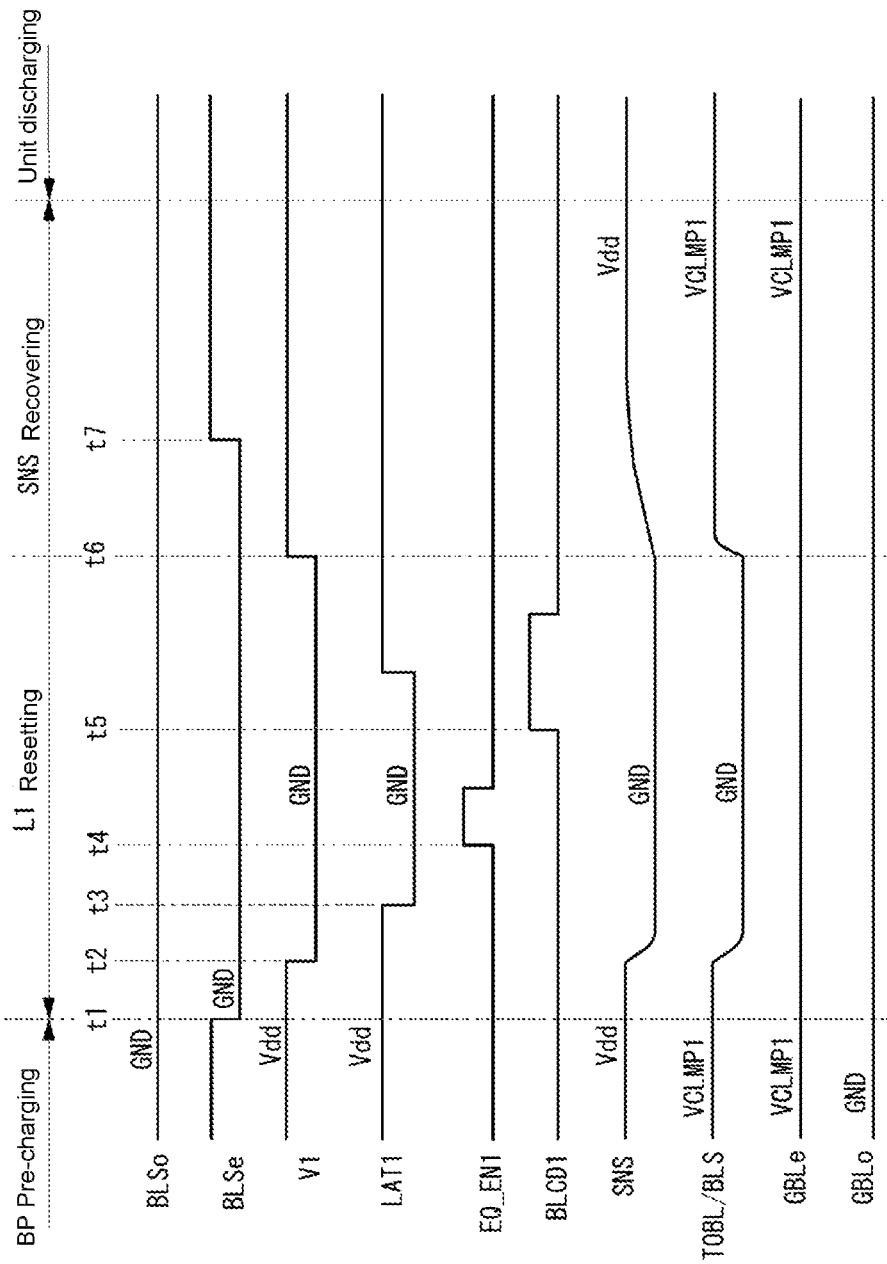
FIG. 7 is a timing diagram illustrating a resetting operation of a latch circuit of the flash memory in an embodiment of the invention.

FIG. 7 shows a timing diagram during the resetting of the latch L1. The pre-charging of the bit line is performed in the same manner as in the conventional art so it is not illustrated in detail but is performed as follows. First, the voltage supply node V1 is transitioned to the supply voltage Vdd; the transistor BLPRE is turned on; the sense node SNS is charged to the Vdd level. Further, the transistor BLCLAMP and the transistor BLCN are turned on to charge the node BLS to VCLMP1. There is a relationship of Vdd≥VCLMP1. At this time, the transistor BLCD1, the transistor BLCD2 and the transistor REG are turned off. Furthermore, the transistor BLSe is turned on (here, it is assumed that the even bit line GBLe is selected), and the node BLS is electrically connected to the even bit line GBLe. The bit line side select transistor TD of the NAND string connected to the even bit line GBLe is turned on; the source line side select transistor TS is not turned on; the pass voltage is applied to the selected page and the non-selected page. Thus, the even bit line GBLe is pre-charged with a clamp voltage VCLMP1. On the other hand, the non-selected odd bit line GBLo is electrically connected to the GND of the virtual power VIRPWR through the transistor YBLo.

When the pre-charging of the bit line is completed, the resetting of the latch L1 is performed. In a resetting period, the transistor BLPRE, the transistor BLCN and the transistor BLCLAMP are turned on. As shown in FIG. 7, at time t1, the transistor BLSe is turned off, and the even bit line GBLe is electrically disconnected from the page buffer/sense circuit 170. Next, at time t2, the voltage supply node V1 is transitioned to GND. As a result, the sense node SNS drops from the supply voltage Vdd to the GND level, and the node TOBL and the node BLS drop from the clamp voltage VCLMP1 to the GND level.

Next, at time t3, the latch enable signal LAT1 for resetting the latch L1 is transitioned from the H level to the L level, and the latch L1 is in a resettable state. Next, at time t4, the transistor EQ is turned on for a certain period of time to short-circuit the node SLR1 and the node SLS1 to the same potential, and at time t5, the transistor BLCD1 is turned on for a certain period of time. As a result, the charge of the node SLR1 is discharged to the GND of the voltage supply node V1 through the sense node SNS, and the resetting of the latch L1 is completed.

After the resetting of the latch L1, a recovering is performed on the sense node SNS and the like. That is, the sense node SNS, the node TOBL and the node BLS are recharged to restore the voltages of these nodes to a pre-charged state before the resetting of the latch L1. At time t6, the voltage supply node V1 is transitioned from GND to the supply voltage Vdd. Accordingly, the sense node SNS is recharged to Vdd, and the node TOBL and the node BLS are recharged to the clamp voltage VCLMP1. Next, at time t7, the transistor BLSe is turned on, and the even bit line GBLe is electrically connected to the page buffer/sense circuit 170.

The discharging and sensing of the NAND string performed after the resetting of the latch L1 is performed in the same manner as in the conventional art (not shown). That is, in the discharging the NAND string, the transistor BLSe is turned off; the source line side select transistor TS of the NAND string is turned on, and the NAND string is electrically connected to the source line SL. Further, a gate voltage for generating a clamp voltage VCLMP2 at the node TOBL is applied to the transistor BLCLAMP. VCLMP1>VCLMP2. After that, by turning on the transistor BLSe for a certain period of time, a potential corresponding to the data "0" or "1" of the selected memory cell appears at the sense node SNS. If the selected memory cell holds the data "0", the potential of the bit line is not discharged to the source line SL. Therefore, the potential of the sense node SNS hardly changes. On the other hand, if the selected memory cell holds the data "1", the potential of the bit line is discharged to the source line SL, and the potential of the read node SNS decreases. In this way, the sense node SNS senses the charge corresponding to the data "0" and "1" of the selected memory cell. Then, the charge sensed by the sense node SNS is transmitted to the node SLR1 of the latch L1 through the transistor BLCD1.

In this embodiment, since the resetting of the latch L1 is performed between the pre-charging period of the bit line and the discharging period of the NAND string to ensure the resetting of the latch L1, a data retention reliability of the latch L1 may be improved. Furthermore, as soon as the data in the latch L1 is transmitted to the latch L2, the array readout can be started immediately.

Figure 8:
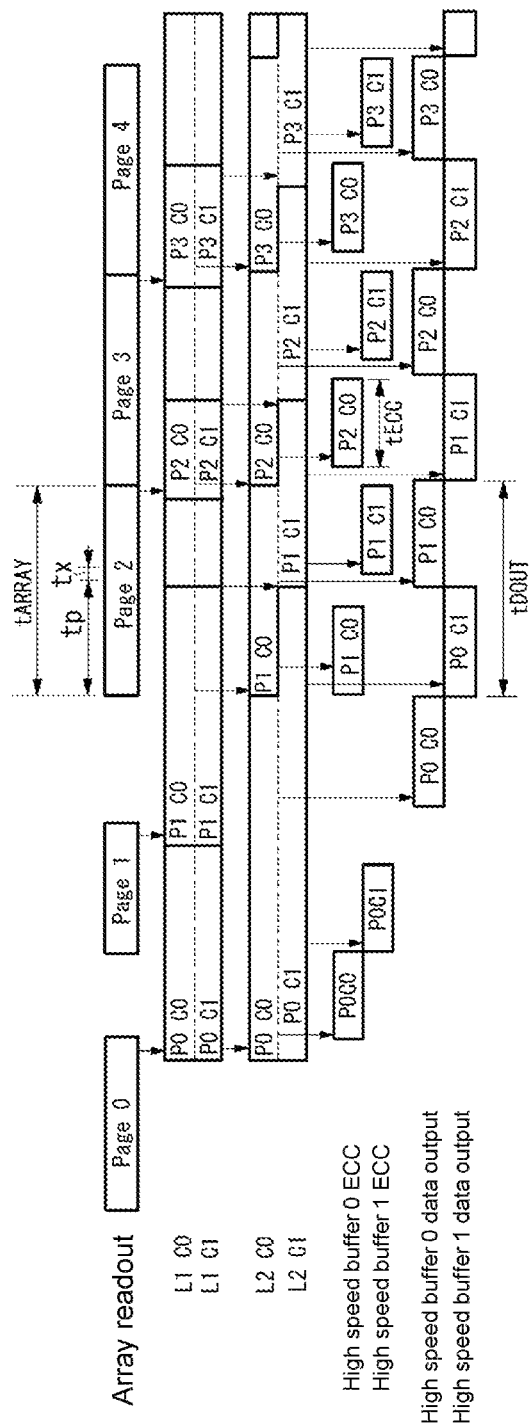
FIG. 8 is a timing chart of a continuous readout operation of pages in an embodiment of the invention.

Next, an improved continuous readout of pages to which the resetting of the latch L1 based on the present embodiment is applied will be described as follows. FIG. 8 is a timing chart when performing the improved continuous readout of pages. FIG. 8 shows an example in which a page P0 is a starting address. The starting address can be arbitrarily selected. tp is a period from the start timing of the array readout to the completion of the pre-charging of the bit line, and tx is a period required for the resetting of the latch L1. As shown in FIG. 8, the substantial continuous readout using the latch L1 and the latch L2 starts from a reading of the page P2, and the start timing of the array readout of the page P2 is earlier than that in the conventional art shown in FIG. 2. In the continuous readout shown in FIG. 2, the start timing of the array readout of the page P2 is a timepoint at which a transmission of data (P1C1) of the page P1 from the latch L1 to the latch L2 is completed. That is, after the data of the page P1 is held by the latch L2, the data of the next page P2 is transmitted to the latch L1.

On the other hand, in the improved continuous readout, the start timing of the array readout of the page P2 is the same as a timing for transmitting the data (P1C0) of the page P1 of the first cache C0 of the latch L1 to the latch L2. As described above, even if the timing of the array readout of the page P2 is advanced, a certain time is actually required for the array readout to complete. If the external clock signal ExCLK with high speed frequency is used to shorten the continuous readout time, at the timepoint for transmitting the data of the page P2 read from the array to the latch L1, the transmission of the data (P1C1) of the page P1 from the latch L1 to the latch L2 has already completed. Since the resetting of the latch L1 is performed during the array readout, the resetting of the latch L1 is not affected at all even if the start timing of the array readout is advanced.

In the improved continuous readout, an array readout time tARRAY is defined by a start timing of the array readout and an end timing of the array readout. The end timing of the array readout of the page P2 is the start timing of the array readout of the next page P3, and the array read time tARRAY also continues as the page P2, the page P3, the page P4, . . . , are continuously read.

By advancing the start timing of the readout of the memory cell array in the improved continuous readout operation, the constraint of Expression (1) of the conventional continuous readout operation is relaxed as shown by Expression (2) so that the data output using the external clock signal ExCLK with high speed frequency may be performed.

$$tARRAY < tDOUT(1\ page) \quad (1)$$

$$tECC < tDOUT(\tfrac{1}{2}\ page) \quad (2)$$

That is, if a time tDOUT for outputting data of 1 page is longer than the array readout time tARRAY and the time for outputting data of ½ page is longer than a time tECC of the ECC process, a continuous readout with higher speed compared to the convention art may then be realized. In FIG. 8, the following cases are illustrated. Compared to the array readout time tARRAY of the page P2, the time tDOUT for outputting, which is a sum of the time for outputting the data of the second cache of the page P0 and a time for outputting the data of the first cache of the page P1, is longer. The array readout time tARRAY of the page P2 is from a timepoint at which the transmission of the data of the first cache C0 of the page P1 from the latch L1 to the latch L2 starts until a timepoint at which the transmission of the data of the first cache C0 of the next page P2 from the latch L1 to the latch L2 starts. The time tDOUT for outputting the data of the second cache C1 of the latch L2 is longer than the time tECC for performing the ECC process on the data of the first cache C0 of the latch L2.

In the improved continuous readout operation, because the timing for starting the resetting of the latch L1 is after the pre-charging of the bit line is completed, if the period from the start timing of the array readout to the time immediately before the resetting of the latch L1 is started is set to tp, a constraint of Expression (3) is added in addition to Expression (2). That is, the data in the latch L1 needs to be transmitted to the latch L2.

$$tDOUT(\tfrac{1}{2}\ page) < tp \quad (3).$$

However, since the pre-charging period of the bit line is sufficiently long, as long as Expression (2) and Expression (3) are satisfied, the improved continuous readout shown in FIG. 8 can achieved high speed.

In this way, in the improved continuous readout operation, the resetting of the latch L1 may be ensured and a high speed data readout speed may be achieved.

Next, another embodiment of the invention is described below. In the foregoing embodiment, the resetting of the latch L1 is performed between a pre-charging operation of the bit line and a discharging operation of the NAND string. However, in another embodiment, the resetting of the latch L1 is performed during the discharging operation of the NAND string.

As described above, the resetting of the latch L1 can be implemented as long as the sense node is in a free state without being affected by others. During the discharging operation of the NAND string, the transistor BLSe is turned off, and the sense node SNS is electrically isolated from the bit line. Therefore, a resetting operation of the latch L1 from time t2 to time t6 shown in FIG. 7 may be performed in parallel in time with the discharging operation of the NAND string.

According to the present embodiment, the resetting of the latch L1 is performed in parallel during the discharging period of the NAND string. Compared to the resetting of the latch L1 performed between the pre-charging operation of the bit line and the discharging operation of the NAND string, the array read time tARRAY may in fact be shortened and the high speed data output may be realized by using the continuous readout.

The preferable embodiment of the disclosure had been described in detail above, but the disclosure is not limited to a specific embodiment. It will be apparent to those skilled in the art that various modifications and variations can be made to the structure of the present disclosure without departing from the scope or spirit of the disclosure.

What is claimed is:

1. A readout method for a NAND flash memory, comprising:
   a pre-charging step performing a pre-charging on a bit line and a NAND string connected to the bit line through a sense node;
   a resetting step electrically connecting a node of a latch circuit to a reference potential through the sense node and performing a resetting on the latch circuit after the pre-charging;
   a discharging step performing a discharging on the NAND string after the resetting; and
   each of the steps is performed in a continuous readout of pages;
   wherein
   the continuous readout of the pages comprises:
   holding data read from a selected page of a memory cell array in the latch circuit, and after the data held in the latch circuit is transmitted to another latch circuit, holding data read from a next selected page in the latch circuit; and
   continuously outputting the data held in the another latch circuit to an external part in synchronization with an external clock signal.

2. A readout method for a NAND flash memory, comprising:
   a pre-charging step performing a pre-charging on a bit line and a NAND string connected to the bit line through a sense node;
   a resetting step electrically connecting a node of a latch circuit to a reference potential through the sense node and performing a resetting on the latch circuit during a discharging period of the NAND string; and
   each of the steps is performed in a continuous readout of pages;
   wherein
   the continuous readout of the pages comprises:
   holding data read from a selected page of a memory cell array in the latch circuit, and after the data held in the latch circuit is transmitted to another latch circuit, holding data read from a next selected page in the latch circuit; and
   continuously outputting the data held in the another latch circuit to an external part in synchronization with an external clock signal.

3. The readout method of claim 2, wherein
the pre-charging step comprises: generating a voltage for the pre-charging at a voltage supply node; electrically connecting the voltage supply node to the sense node by a first select transistor; and electrically connecting the sense node to the bit line by a second select transistor, and
the resetting step comprises: generating the reference voltage at the voltage supply node; electrically connecting the voltage supply node to the latch circuit by the first select transistor; and electrically isolating the sense node by the second select transistor.

4. The method of claim 2, wherein:
the continuous readout of the pages further comprises: while performing an error check and correction also known as an ECC process on data of a first part of the another latch 10 circuit, outputting data of a second part subjected to the ECC process to the external part, and while outputting the data of the first part subjected to the ECC process to the external part, performing the ECC process on the data of the second part.

5. The readout method of claim 4, comprising:
after the data of the first part of the another latch circuit subjected to the ECC process is outputted to the external part, transmitting data of a first part of the next selected page of the latch circuit to the first part of the another latch circuit; and
after the data of the second part of the another latch circuit subjected to the ECC process is outputted to the external part, transmitting data of a second part of the next selected page of the latch circuit to the second part of the another latch circuit.

6. The readout method of claim 4, wherein
the continuous readout is a first continuous readout having a constraint expressed by tARRAY+tECC<tDOUT, wherein each of the data of the first part and the data of the second part is data of ½ page, tARRAY is a time required for reading the selected page, tECC is a time required for performing the ECC process on ½ page, tDOUT is a time required for outputting all data of one page.

7. The readout method of claim 4, wherein
the continuous readout is a second continuous readout having a constraint expressed by tARRAY<tDOUT and tECC<tDOUT(½ page), wherein each of the data of the first part and the data of the second part is data of ½ page, tARRAY is a time required for reading the selected page, tECC is a time required for performing the ECC process on ½ page, tDOUT is a time required for outputting all data of one page, tDOUT(½ page) is a time required for outputting data of ½ page.

8. The readout method of claim 7, wherein
the second continuous readout has a earlier read timing for the selected page of the memory cell array compared to the first continuous readout.

9. A semiconductor apparatus, comprising:
a NAND type memory cell array;
a readout component, reading data from a selected page of the memory cell array,
an output component, outputting the data read by the readout component to an external part,
wherein the readout component comprises a page buffer/sense circuit connected to the memory cell array through a bit line, and
while performing a continuous readout of pages, the readout component implements a resetting of a latch circuit included by the page buffer/sense circuit in a discharging period of a NAND string after a pre-charging is performed on the bit line or between a pre-charging period of the bit line and a discharging period of a NAND string;
wherein
the page buffer/sense circuit further comprises another latch circuit for receiving the data held by the latch circuit, and
when performing the continuous readout, the readout component causes the latch circuit to hold the data read from a next selected page of the memory cell array while the data of the other latch circuit is output.

10. The semiconductor apparatus of claim 9, wherein
the page buffer/sense circuit comprises: a voltage supply node, a sense node, a latch circuit, a first select transistor connected between the voltage supply node and the sense node, a second select transistor connected between the sense node and the bit line, and a third select transistor connected between the sense node and the latch circuit, wherein
the resetting is performed on the latch circuit by turning on the first select transistor and the third select transistor, turning off the second select transistor, and electrically connecting the latch circuit to a reference potential of the voltage supply node.

11. The semiconductor apparatus of claim 10, wherein
the readout component turns on the first select transistor and the second select transistor, turns off the third select transistor, and pre-charges the bit line with a voltage of the voltage supply node.

12. The semiconductor apparatus of claim 9, wherein
when the readout component performs a continuous readout of pages, the output component continuously outputs the read data in synchronization with an external clock signal.

13. The semiconductor apparatus of claim 9, wherein:
the semiconductor apparatus further comprises an error checking and correction circuit for performing an error checking and correction for data, when performing a continuous readout, the readout component outputs data held by a second part of the another latch circuit subjected to an ECC process while the ECC process is performed on data held by a first part of the another latch circuit through the error checking and correction circuit.

* * * * *